US011519796B2

(12) United States Patent
Li et al.

(10) Patent No.: US 11,519,796 B2
(45) Date of Patent: Dec. 6, 2022

(54) STRESS-INDUCED MAGNETIC FIELD SIGNAL ACQUISITION METHOD AND STRESS MEASUREMENT METHOD BASED THEREON

(71) Applicant: Yichang Huateng Pipeline Engineering Co., Ltd., Hubei (CN)

(72) Inventors: Hongmei Li, Yichang (CN); Fuchen Zhang, Yichang (CN); Chengxiang Shi, Yichang (CN)

(73) Assignee: Yichang Huateng Pipeline Engineering Co., Ltd.

( * ) Notice: Subject to any disclaimer, the term of this patent is extended or adjusted under 35 U.S.C. 154(b) by 214 days.

(21) Appl. No.: 16/727,755

(22) Filed: Dec. 26, 2019

(65) Prior Publication Data
US 2020/0209076 A1 Jul. 2, 2020

(30) Foreign Application Priority Data

Dec. 29, 2018 (CN) .......................... 201811631045.3

(51) Int. Cl.
*G01L 1/12* (2006.01)
*G01L 25/00* (2006.01)
*G01N 27/72* (2006.01)
*G01R 33/12* (2006.01)
*G01R 33/18* (2006.01)

(52) U.S. Cl.
CPC ................ *G01L 1/12* (2013.01); *G01L 25/00* (2013.01); *G01L 1/127* (2013.01); *G01N 27/72* (2013.01); *G01R 33/1223* (2013.01); *G01R 33/18* (2013.01)

(58) Field of Classification Search
CPC ........... G01L 1/12; G01L 1/127; G01L 25/00; G01N 27/72; G01R 33/1223; G01R 33/18
See application file for complete search history.

(56) References Cited

U.S. PATENT DOCUMENTS

| 4,881,030 A * | 11/1989 | Stuecker | G01N 27/725 324/202 |
| 6,239,593 B1 * | 5/2001 | Burkhardt | G01B 7/24 324/209 |
| 8,001,849 B2 * | 8/2011 | Weng | G01L 3/105 73/862.333 |
| 2010/0242626 A1 * | 9/2010 | Weng | G01L 3/105 73/862.333 |
| 2013/0221950 A1 * | 8/2013 | Lanter | G01L 1/122 324/207.2 |

* cited by examiner

Primary Examiner — Jonathan M Dunlap
(74) Attorney, Agent, or Firm — Rumit Ranjit Kanakia

(57) ABSTRACT

A method for stress-induced magnetic field signal acquisition and stress measurement is disclosed. The method can include the following steps: a1, conducting AC magnetization on a to-be-tested structure by using an AC magnetic field with preset frequencies and strengths, and acquiring the excitation magnetic field signals in at least one cycle; a2, subtracting the excitation magnetic field signals in at least one cycle of a stress-free sample having the same material as the to-be-tested structure from the excitation magnetic field signals acquired in step a1 to obtain a stress-induced magnetic field signals of the to-be-tested structure; a3, quantitatively assessing the stresses in the to-be-tested structure by comparing the mean values of the stress-induced magnetic field signals acquired in step a2 with the pre-calibrated relationship of stresses and the mean values of the stress-induced magnetic field signals for the material of the to-be-tested structure.

3 Claims, 4 Drawing Sheets

STRESS-INDUCED MAGNETIC FIELD SIGNAL ACQUISITION METHOD AND STRESS MEASUREMENT METHOD BASED THEREON

CROSS REFERENCE TO RELATED APPLICATION

This application claims the benefit of and priority to Chinese Patent Application No. CN 201811631045.3, entitled "STRESS-INDUCED MAGNETIC FIELD SIGNAL ACQUISITION METHOD AND STRESS MEASUREMENT METHOD BASED THEREON," which was filed on Dec. 29, 2018. The entirety of Chinese Patent Application No. CN 201811631045.3 is incorporated herein by reference as if set forth fully herein.

TECHNICAL FIELD

The disclosed subject matter relates to the field of nondestructive testing technologies of metal materials, and in particular to a stress-induced magnetic field signal acquisition method and a stress measurement method of metal materials based thereon.

BACKGROUND

The stress in a material is a key factor to cause structural damages and mechanical failures. Quantitative measurement or assessment of the stresses is very important to ensure the integrity of the structure in the life of service and to reduce the maintenance costs. In the last century, it was found that the stresses can change magnetic properties of a ferromagnetic material, which is widely known as magneto-mechanical effect. The magneto-mechanical effect provides a greatly potential for the quantitative assessment of stress and leads to a series of stress assessment technologies, such as the technologies with magnetic memory testing, magnetic flux leakage testing, eddy-current testing, Barkhausen testing and the like. The above technologies acquire the induced magnetic field signals due to the magneto-mechanical effect and try to assess quantitatively the characteristic stresses. However, the induced magnetic field signals of the magneto-mechanical effect are influenced simultaneously by additional multiple factors, for instance, the sensors, materials, and environment. Because of the above disturbance to magnetic signals of the magneto-stress effect, the existing stress measurement technologies based on the induced magnetic field are of low accuracy and have limited applications.

SUMMARY

The disclosed subject matter provides a stress-induced magnetic field signal acquisition method and an in-field stress measurement method based thereon to solve a technical problem that the stress-induced magnetic field signals of magneto-mechanical effect are influenced by numerous factors, which cause low accuracy of quantitative characterization capability of the in-field stress.

According to one aspect of the disclosed technology the disclosed subject matter provides a stress-induced magnetic field signal acquisition method, which can include the following steps:

a1, conducting Alternating Current (AC) magnetization on a to-be-tested structure by using an AC magnetic field with preset frequency and strength, and acquiring an excitation magnetic field signal in at least one cycle;

a2, conducting AC magnetization on a sample having the same material with the to-be-tested structure in an unstressed state by utilizing the AC magnetic field in step a1, and extracting an excitation magnetic field signal in at least one cycle; and a3, subtracting the excitation magnetic field signal acquired in step a2 from the excitation magnetic field signal acquired in step a1 to obtain a stress-induced magnetic field signal in one cycle of the to-be-tested structure.

According to another aspect of the disclosed technology, the disclosed subject matter provides a stress measurement method based on the stress-induced magnetic field signal acquisition method, which can include the following steps:

b1, conducting AC magnetization on a to-be-tested structure by using an AC magnetic field with preset frequency and strength, and acquiring a stress-induced magnetic field signal in one cycle of the to-be-tested structure; and b2, quantitatively assessing the stresses in the to-be-tested structure by comparing the mean values of the stress-induced magnetic field signals of the to-be-tested structure acquired in step b1 with a pre-calibrated relationship of stresses and the mean values of the stress-induced magnetic field signals of a material of the to-be-tested structure.

In some embodiments, in step b2, the pre-calibrated quantitative relationship of the stress and the stress-induced magnetic field signal can be determined by the following steps:

b11, manufacturing a test sample by utilizing the same material with the to-be-tested structure;

b12, loading different stresses to the test sample, simultaneously conducting AC magnetization on the test sample by utilizing an AC magnetic field having the same parameters with the AC magnetic field in step a1, and acquiring corresponding stress-induced magnetic field signals of the test sample under different stresses with the method described in steps a1-a3; and b13, calculating the mean values of the stress-induced magnetic field signals of the test sample; and b14, matching stress values of the test sample under different stresses with corresponding mean values of the stress-induced magnetic field signals, and calibrating the relationship of stresses and the mean values of the stress-induced magnetic field signals of the material of the test sample.

The disclosed subject matter can extract the stress-induced magnetic field signals from the excitation magnetic field signals based on the magneto-mechanical effect. The stress-induced magnetic field signals can be used for conducting nondestructive stress testing and assessment for the object metal parts, which could be ferromagnetic and non-ferromagnetic, such as aluminum.

At least some of the beneficial effects of the disclosed subject matter include:

compared with technologies of conducting quantitative assessment for the stress based on the induced magnetic field signals in the prior art, the disclosed subject matter can acquire the excitation magnetic field signals based on the magneto-mechanical effect of the test material. In addition, the relation of the stresses and the stress-induced magnetic field signals for the test material are calibrated, which can be applied in the nondestructive stress assessment of the structure. Because the signals of the excitation magnetic field are known, and there is no need for additional measurements or magnetic sensors, the disclosed subject matter can improve the accuracy of stress assessment and simplify the devices for the stress assessment technologies.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. The foregoing and other aspects and features of the disclosed technology will become more apparent from the following detailed description, which proceeds with reference to the accompanying figures.

BRIEF DESCRIPTION OF THE DRAWINGS

The accompanying drawings are provided for further understanding of the disclosed subject matter. The drawings constitute a part of the specification, and are intended to explain some example, non-limiting embodiments of the disclosed subject matter. In the accompanying drawings.

DETAILED DESCRIPTION

The following describes examples of the disclosed subject matter with reference to the accompanying drawings.

Figure 1:
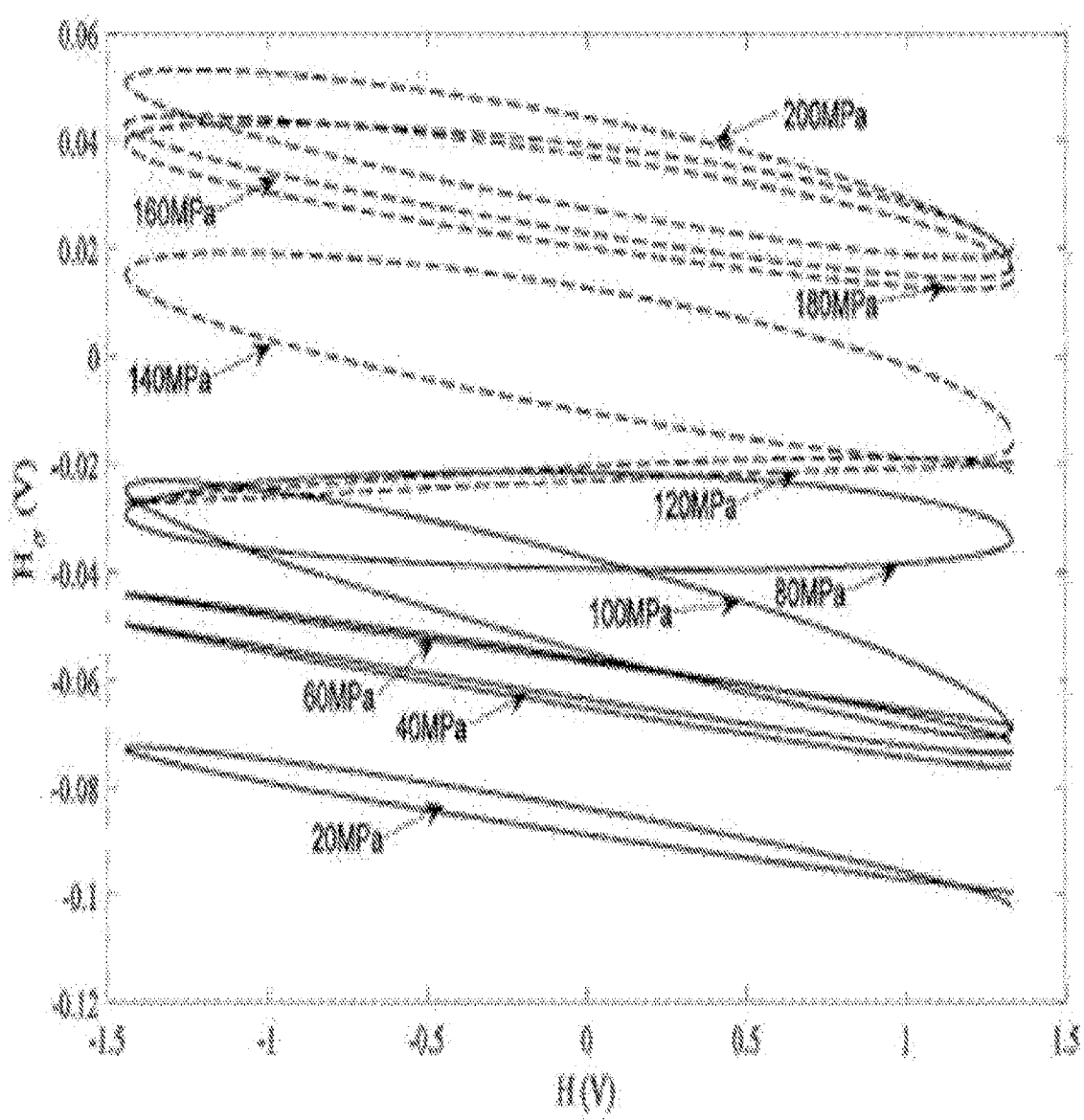
FIG. 1 shows a relationship of a stress-induced magnetic field and an excited magnetic field according to an example embodiment of the disclosed subject matter.
Figure 2:
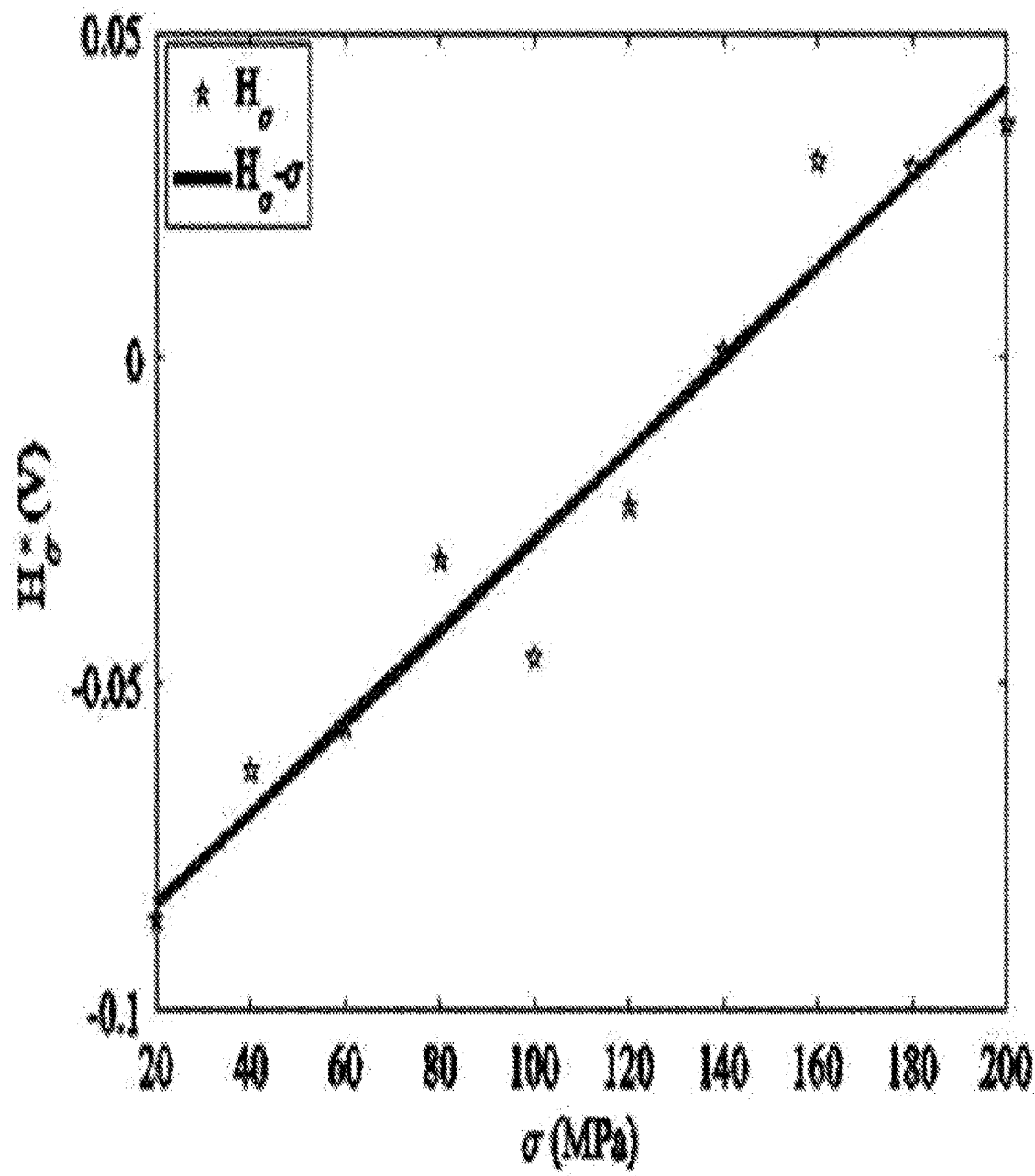
FIG. 2 shows a relationship of the stresses and the stress-induced magnetic field signal mean values according to an example embodiment of the disclosed subject matter.

One example embodiment of the disclosed subject matter provides a stress measurement method based on the acquisition of stress-induced magnetic field signals, which can include the following two stages:

stage 1: relation modeling and parameter measuring, which can include the following steps:

b11, manufacturing a test sample by utilizing the same material with a to-be-tested component, wherein in one example embodiment, a silicon steel material can be utilized;

b12, referring to FIG. 1, respectively loading elastic stresses of, e.g., 20 MPa, 40 MPa, 60 MPa, 80 MPa, 100 MPa, 120 MPa, 140 MPa, 160 MPa, 180 MPa and 200 MPa to the test sample, simultaneously conducting AC magnetization on the test sample under the above stresses by utilizing an AC magnetic field with a preset frequency (e.g., 300 Hz) and a preset strength; acquiring series of excitation magnetic field signals H(V) in one cycle of the test sample under different stresses; acquiring an excitation magnetic field signal in one cycle of the test sample in an unstressed state; and subtracting the excitation magnetic field signal in one cycle of the test sample in the unstressed state from the excitation magnetic field signals in one cycle of the test sample under different stresses to obtain the stress-induced magnetic field signals $H\sigma(V)$ of the test sample under different stresses; and b13, referring to FIG. 2, calculating a series of mean values $H\sigma^*(V)$ of the stress-induced magnetic field signals $H\sigma(V)$ of the test sample under different stresses, matching stress values 6 of the test sample with the corresponding mean values $H\sigma^*(V)$ of the stress-induced magnetic field signals under different stresses, and calibrating the relationship of stresses and the stress-induced magnetic field signal mean values of a material of the test sample, wherein silicon steel can be utilized according to one example embodiment.

stage 2: stress assessment of a to-be-tested structure, which can include the following steps:

b1, conducting AC magnetization on a to-be-tested structure by using an AC magnetic field with the same frequency and strength in the assessment stage, and acquiring an excitation magnetic field signal in one cycle;

b2, subtracting the excitation magnetic field signal in one cycle of a structure having the same material with the to-be-tested structure in an unstressed state from the excitation magnetic field signal of the to-be-tested structure in one cycle to obtain a stress-induced magnetic field signal of the to-be-tested structure; and b3, calculating the mean values $H\sigma^*(V)$ of the stress-induced magnetic field signals $H\sigma(V)$ of the test structure; and b4, assessing the stresses in the to-be-tested structure by comparing the mean values of the stress-induced magnetic field signals of the to-be-tested structure acquired in step b3 with the calibrated quantitative relationship of the stresses and the stress-induced magnetic field signals of a material of the to-be-tested structure in stage 1.

Figure 3:
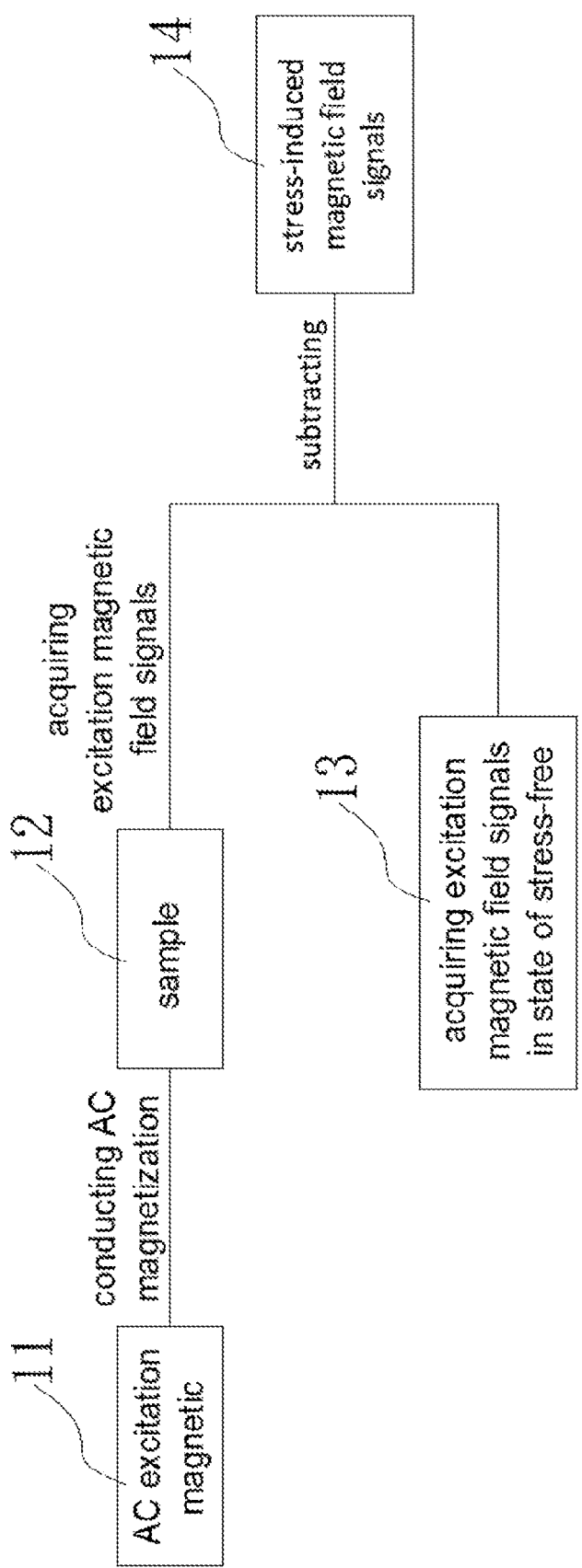
FIG. 3 shows a schematic flowchart of calculating the stress-induced magnetic field signals based on the excitation magnetic field signals under different stresses and the excitation magnetic field signals in an unstressed state.

A procedure for calculating the magnetic field signals is as illustrated in FIG. 3. AC magnetization is conducted on the sample 12 (including the to-be-tested structure or the test sample) using the AC excitation magnetic 11, and the excitation magnetic field signals are acquired. Then, the excitation magnetic field signals 13 of the sample (the to-be-tested structure or the test sample) in a stress-free state are acquired. Finally, the stress-induced magnetic field signals 14 are acquired by a subtraction operation.

Figure 4:
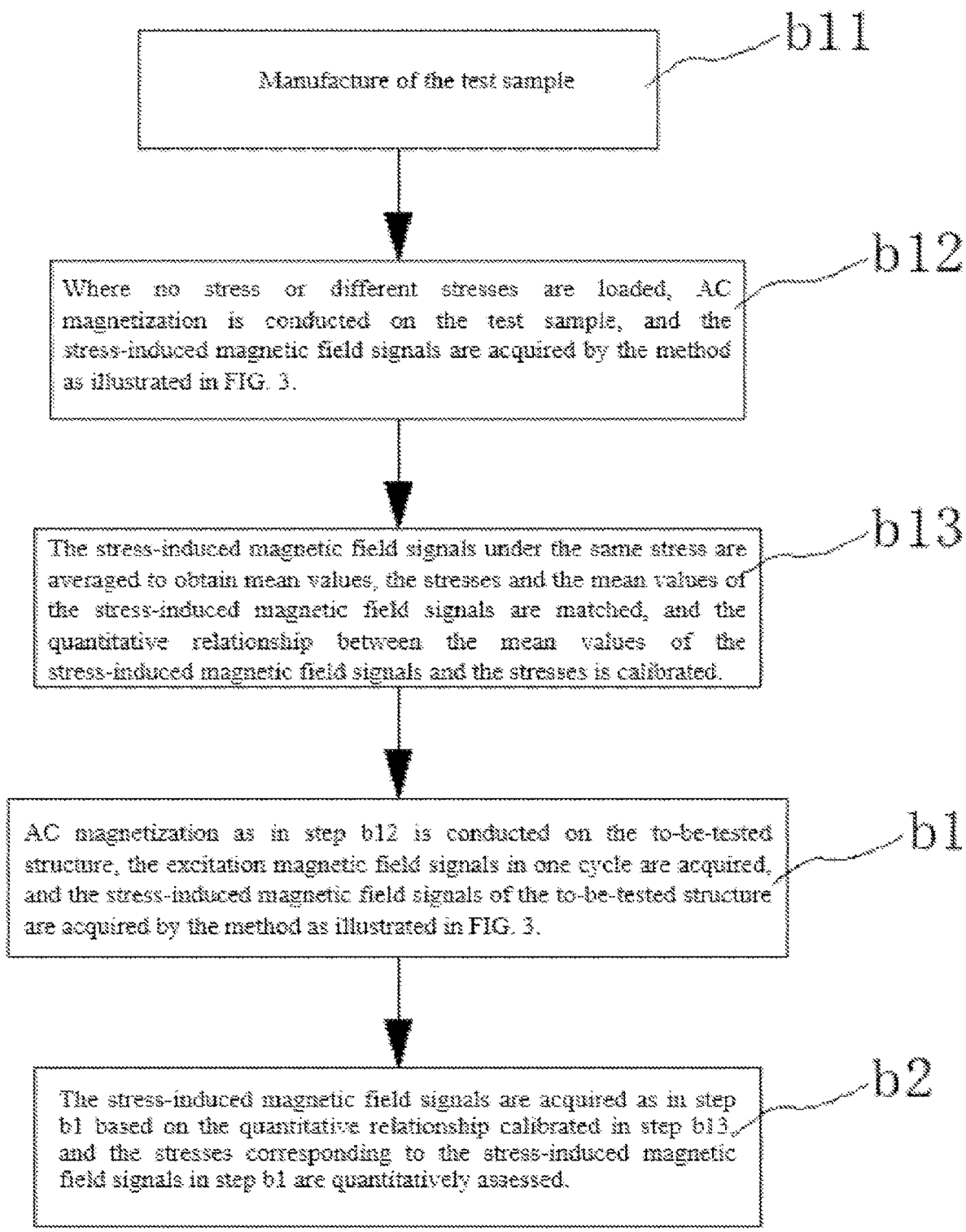
FIG. 4 shows a schematic diagram of steps in a stress detection method according to the present disclosure.

Referring to FIG. 4, steps in a typical procedure in the detection method according to the present application are illustrated.

To sum up, compared with technologies of conducting quantitative characterization on the stress based on the induced magnetic field signals of the magneto-mechanical effect in the prior art, embodiments of the disclosed technology can acquire the excitation magnetic field signals of the magneto-mechanical effect of the test sample under different stresses. Therefore, the stress-induced magnetic field signals of the test sample under different stresses can be obtained, and the quantitative relationship of stress and the stress-induced magnetic field signal of the test material can be calibrated. The quantitative relationship can be applied to nondestructive quantitative assessment of the stress of the structure having the same material with the test sample. Because the excitation magnetic field signal is influenced by a few factors and the measurement of the excitation magnetic field signal does not require a magnetic field sensor, the disclosed method can improve the accuracy of stress assessment and simplify the devices of the magneto-mechanical assessment technologies.

In view of the many possible embodiments to which the principles of the disclosed subject matter may be applied, it should be recognized that the illustrated embodiments are only representative examples and should not be taken as limiting the scope of the claims to those preferred examples. Rather, the scope of the claimed subject matter is defined by the following claims. We therefore claim as our invention all that comes within the scope of these claims.

We claim:

1. A stress-induced magnetic field signal acquisition method, comprising the steps of:

a1, conducting AC magnetization on a to-be-tested structure with a preset frequency and a preset strength, and acquiring excitation magnetic field signals in at least one cycle;

a2, conducting the same AC magnetization as in step a1, on a sample of the same material as the to-be-tested structure in state of stress-free, and acquiring the excitation magnetic field signals in at least one cycle; and a3, subtracting the excitation magnetic field signals acquired in step a2 from the excitation magnetic field signals acquired in step a1 to obtain stress-induced magnetic field signals in at least one cycle of the to-be-tested structure.

2. A stress measurement method based on claim 1, comprising the steps of: b11, manufacturing a test sample with the same material as the to-be-tested structure;

b12, loading different stresses or no stress to the test sample, conducting AC magnetization on the test sample with the preset frequency and the preset strength under different stress conditions and an unstressed condition, and acquiring stress-induced magnetic field signals of the test sample under different stress conditions;

wherein the stress-induced magnetic field signals are acquired as in claim 1 by subtracting the excitation magnetic field signals in one cycle of the test sample under the unstressed condition from the excitation magnetic field signals in one cycle of the test sample under the different stress conditions;

b13, calculating a series of mean values $H\sigma^*(V)$ of the stress-induced magnetic field signals $H\sigma(V)$ in one cycle of the test sample under the same stress condition, matching stress values a of the test sample with the corresponding mean values $H\sigma^*(V)$ of the stress-induced magnetic field signals under different stress conditions, and calibrating a quantitative relationship of the mean values of the stress-induced magnetic field signals of a material of the test sample and the stresses;

b1, conducting the same AC magnetization as in step b12, on the to-be-tested structure, and acquiring an excitation magnetic field signal in one cycle;

b2, subtracting the excitation magnetic field signals of the test sample having the same material with the to-be-tested structure in an unstressed state in step b12 from the excitation magnetic field signals in the one cycle of the to-be-tested structure to obtain stress-induced magnetic field signals of the to-be-tested structure, and calculating mean values of the stress-induced magnetic field signals in one cycle;

b3, based on the quantitative relationship calibrated in step b13, quantitatively assessing the stresses corresponding to the mean values of the stress-induced magnetic field signals in one cycle acquired in step b2, to quantitatively assess stresses in the to-be-tested structure.

3. The stress measurement method according to claim 2, wherein in step b12, the loaded stresses are elastic stresses of 20 MPa, 40 MPa, 60 MPa, 80 MPa, 100 MPa, 120 MPa, 140 MPa, 160 MPa, 180 MPa, and 200 MPa, and the frequency of the AC magnetic field is 300 Hz.

* * * * *